US012696650B2

(12) United States Patent
Lee et al.

(10) Patent No.: US 12,696,650 B2
(45) Date of Patent: Jul. 28, 2026

(54) DISPLAY DEVICE AND METHOD OF MANUFACTURING SAME

(71) Applicant: LG Display Co., Ltd., Seoul (KR)

(72) Inventors: Eonseok Lee, Paju-si (KR); Heeyoung Kwack, Paju-si (KR); Taeho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 121 days.

(21) Appl. No.: 18/749,505

(22) Filed: Jun. 20, 2024

(65) Prior Publication Data

US 2026/0052877 A1     Feb. 19, 2026

(30) Foreign Application Priority Data

Aug. 28, 2023     (KR) ........................ 10-2023-0112495

(51) Int. Cl.
 *H10K 59/40* (2023.01)
 *G06F 3/044* (2006.01)
 (Continued)

(52) U.S. Cl.
 CPC ........... *H10K 59/40* (2023.02); *G06F 3/0445* (2019.05); *G06F 3/0446* (2019.05); *H10K 59/1201* (2023.02); *H10K 59/873* (2023.02); *G06F 2203/04102* (2013.01); *G06F 2203/04103* (2013.01); *G06F 2203/04111* (2013.01); *H10K 2102/311* (2023.02)

(58) Field of Classification Search
 CPC .. H10K 59/40; H10K 59/1201; H10K 59/873; H10K 2102/311; G06F 3/0445; G06F 3/0446; G06F 2203/04102; G06F 2203/04103; G06F 2203/04111
 See application file for complete search history.

(56) References Cited

U.S. PATENT DOCUMENTS

| | | |
|---|---|---|
| 12,075,654 B2 | 8/2024 | Heo et al. |
| 2018/0061899 A1 | 3/2018 | Oh et al. |

(Continued)

FOREIGN PATENT DOCUMENTS

| | | |
|---|---|---|
| CN | 106775173 B | 12/2019 |
| CN | 112133736 A | 12/2020 |

(Continued)

OTHER PUBLICATIONS

Japan Patent Office, Office Action, Japanese Patent Application No. 2024-108567, Aug. 12, 2025, 12 pages.

(Continued)

*Primary Examiner* — Deeprose Subedi
(74) *Attorney, Agent, or Firm* — Fenwick & West LLP

(57) ABSTRACT

A display device includes a base substrate including a display area including a plurality of pixels, and a non-display area adjacent to the display area, a first dam on the non-display area of the base substrate, a second dam on the non-display area of the base substrate, the second dam between the first dam and the display area, a touch conductive layer between the first dam and the second dam, and a touch sensor layer including a touch organic layer, the touch organic layer on the touch conductive layer, wherein the touch organic layer ends inside the first dam without extending past an end of the first dam, and the first dam and the second dam include a same material.

26 Claims, 10 Drawing Sheets

(51) Int. Cl.
  *H10K 59/12* (2023.01)
  *H10K 59/80* (2023.01)
  *H10K 102/00* (2023.01)

(56) References Cited

U.S. PATENT DOCUMENTS

| | | | |
|---|---|---|---|
| 2018/0226454 A1 | 8/2018 | Liu et al. | |
| 2019/0326549 A1 | 10/2019 | Kokame et al. | |
| 2020/0043997 A1 | 2/2020 | Sonoda et al. | |
| 2020/0159356 A1 | 5/2020 | Tada et al. | |
| 2021/0159453 A1 | 5/2021 | Takahashi et al. | |
| 2021/0405797 A1 | 12/2021 | Bae et al. | |
| 2022/0028935 A1 | 1/2022 | Park et al. | |
| 2022/0137738 A1 | 5/2022 | Kim et al. | |
| 2022/0285463 A1 | 9/2022 | Lee et al. | |
| 2023/0142449 A1 | 5/2023 | Chu et al. | |
| 2024/0215396 A1* | 6/2024 | Wang | H10K 50/10 |
| 2024/0224718 A1* | 7/2024 | Wang | H10K 50/844 |

FOREIGN PATENT DOCUMENTS

| | | | |
|---|---|---|---|
| CN | 113419641 | A | 9/2021 |
| JP | 2018-113104 | A | 7/2018 |
| JP | 2019-036016 | A | 3/2019 |
| KR | 10-2022-0070903 | A | 5/2022 |
| KR | 10-2022-0077013 | A | 6/2022 |
| KR | 10-2022-0125904 | A | 9/2022 |

OTHER PUBLICATIONS

Taiwan Intellectual Property Office, Office Action, Taiwanese Patent Application No. 113125525, Aug. 28, 2025, 24 pages.
European Patent Office, Extended European Search Report, European Patent Application No. 24189114.2, Jan. 2, 2025, eight pages.

* cited by examiner

DISPLAY DEVICE AND METHOD OF MANUFACTURING SAME

CROSS-REFERENCE TO RELATED APPLICATION

The present application claims the priority of Republic of Korea Patent Application No. 10-2023-0112495, filed on Aug. 28, 2023, which is hereby incorporated by reference in its entirety.

BACKGROUND

Field

The present disclosure relates to a display device and a method of manufacturing the same.

Description of the Related Art

As the information society develops, various demands for display devices for displaying images are increasing, and various types of display devices such as liquid crystal display (LCD) devices and organic light emitting diode (OLED) display devices are utilized.

A display device may include a display panel and a touch sensor layer, and the touch sensor layer may be attached to the display panel as a separate layer from the display panel, but may also be disposed directly on the display panel.

Recently, when the display device including the display panel and the touch sensor layer is manufactured, efforts for reducing the number of masks are being made.

SUMMARY

The present disclosure is directed to providing a display device manufactured using a fewer number of masks.

The objects of the present disclosure are not limited to the above-described object, and other technical objects may be inferred from embodiments below.

A display device according to one embodiment for achieving the object of the present disclosure includes a base substrate including a display area including a plurality of pixels, and a non-display area adjacent to the display area, a first dam on the non-display area of the base substrate, a second dam on the non-display area of the base substrate, and the second dam between the first dam and the display area, a touch conductive layer between the first dam and the second dam, and a touch sensor layer including a touch organic layer, the touch organic layer on the touch conductive layer, wherein the touch organic layer ends inside the first dam without extending past an end of the first dam, and the first dam and the second dam include a same material.

A display device according to another embodiment for achieving the object of the present disclosure includes a display area including a plurality of pixels, and a non-display area located adjacent to the display area, the non-display area including a first dam part surrounding the display area in a plan view of the display device, and a second dam part surrounding the display area in the plan view, the second dam part between the first dam part and the display area in the plan view, wherein the first dam part includes a main dam portion that is spaced apart from the second dam part by a first separation distance, and a pro-truding dam portion that protrudes from the main dam portion and spaced apart from the second dam part by a second separation distance that is greater than the first separation distance.

A display device according to another embodiment for achieving the object of the present disclosure includes a base substrate including a display area having a plurality of pixels, and a non-display area having a pad area, a circuit element layer on the base substrate, a light emitting diode on the circuit element layer in the display area, the light emitting diode connected to the circuit element layer, a first dam in the non-display area, a second dam in the non-display area between the first dam and the display area, a thin film encapsulation layer on the light emitting diode, the thin film encapsulation layer including an encapsulation organic layer that extends to the second dam without extending past an end of the second dam, and a touch sensor layer on the thin film encapsulation layer and configured to sense a touch of the display area, the touch sensor layer including a touch organic layer that overlaps the second dam and extends past the second dam to the first dam without extending past an end of the first dam.

According to the embodiments of the present disclosure, by omitting one of the plurality of touch organic layers of the conventional touch sensor layer, it is possible to reduce the number of masks and simplify the manufacturing of the display device.

Meanwhile, the touch organic layer includes a dam for preventing the overflow of the other organic layer to the pad part. According to the embodiments of the present disclosure, since one touch organic layer is omitted, the dam may be formed using at least one of the organic layers of the display panel. In other words, by forming the dam for simplifying the stacking structure of the display device and preventing the overflow of the other organic layer to the pad part using the at least one of the organic layers of the display panel, it is possible to prevent the overflow of the other touch organic layer to the pad part.

According to the embodiments of the present disclosure, by reducing the number of masks and simplifying the process when the display device is manufactured, it is possible to achieve the process optimization.

However, the effects obtainable from the present disclosure are not limited to the above-described effects, and other effects that are not mentioned will be able to be clearly understood by those skilled in the art to which the present disclosure pertains from the following description.

DETAILED DESCRIPTION

Figure 1:
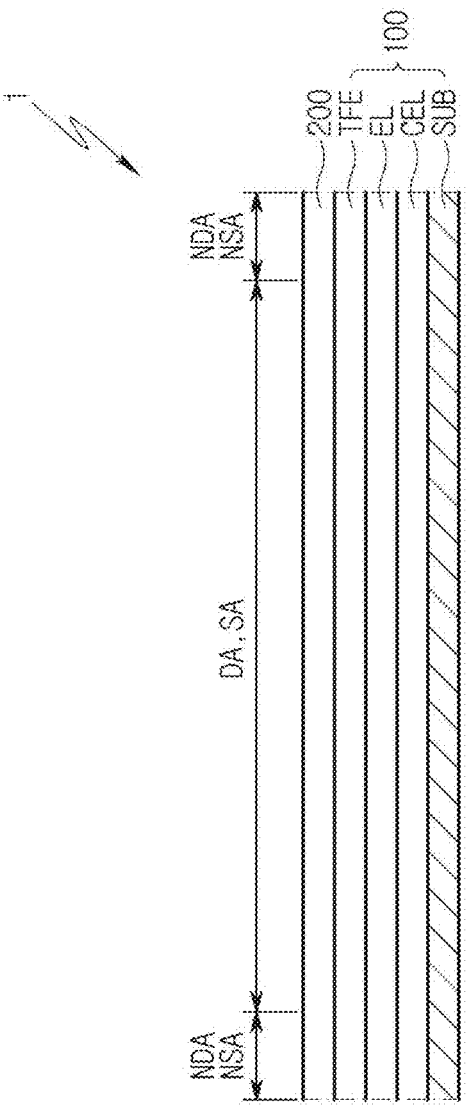
FIG. 1 is a schematic cross-sectional view of a display device according to one or more embodiments of the present disclosure.

Hereinafter, embodiments will be described with reference to the accompanying drawings. In the specification, when a first component (or an area, a layer, a portion, or the like) is described as "on," "connected," or "coupled to" a second component, it means that the first component may be directly connected/coupled to the second component or a third component may be disposed therebetween.

The same reference numerals indicate the same components. In addition, in the drawings, thicknesses, proportions, and dimensions of components are exaggerated for effective description of technical contents. The term "and/or" includes all one or more combinations that may be defined by the associated configurations.

Terms such as first and second may be used to describe various components, but the components are not limited by the terms. The terms are used only for the purpose of distinguishing one component from another. For example, a first component may be referred to as a second component, and similarly, the second component may also be referred to as the first component without departing from the scopes of the embodiments. The singular expression includes the plural expression unless the context clearly dictates otherwise.

Terms such as "under," "at a lower side," "above," and "at an upper side" are used to describe the relationship between the components illustrated in the drawings. The terms are relative concepts and are described with respect to directions marked in the drawings.

It should be understood that term such as "comprises", "includes" or "has" is intended to specify the presence of features, numbers, steps, operations, components, parts, or a combination thereof described in the specification and does not preclude the presence or addition possibility of one or more other features, numbers, steps, operations, components, parts, or combinations thereof in advance.

FIG. 1 is a schematic cross-sectional view of a display device according to one or more embodiments of the present disclosure.

Referring to FIG. 1, a display device 1 according to one or more embodiments may include a display panel 100, and a touch sensor layer 200 formed on the display panel 100. The display panel 100 may include a substrate part SUB, a circuit element layer CEL formed on the substrate part SUB, an organic element layer EL formed on the circuit element layer CEL, a thin film encapsulation layer TFE formed on the organic element layer EL, and the touch sensor layer 200 formed on the thin film encapsulation layer TFE. In one or more embodiments, the display panel 100 may be an organic light emitting display panel including the organic element layer EL. However, the display panel 100 is not limited thereto and may be a liquid crystal display panel or an inorganic light emitting display panel. Hereinafter, an example in which the display panel 100 is the organic light emitting display panel will be mainly described.

The display device 1 may include a display area DA and a non-display area NDA near the display area DA. The display area DA may include a plurality of pixels to generate images. The non-display area NDA may not generate the images. The non-display area NDA may not include pixels, but is not limited thereto.

Figure 4:
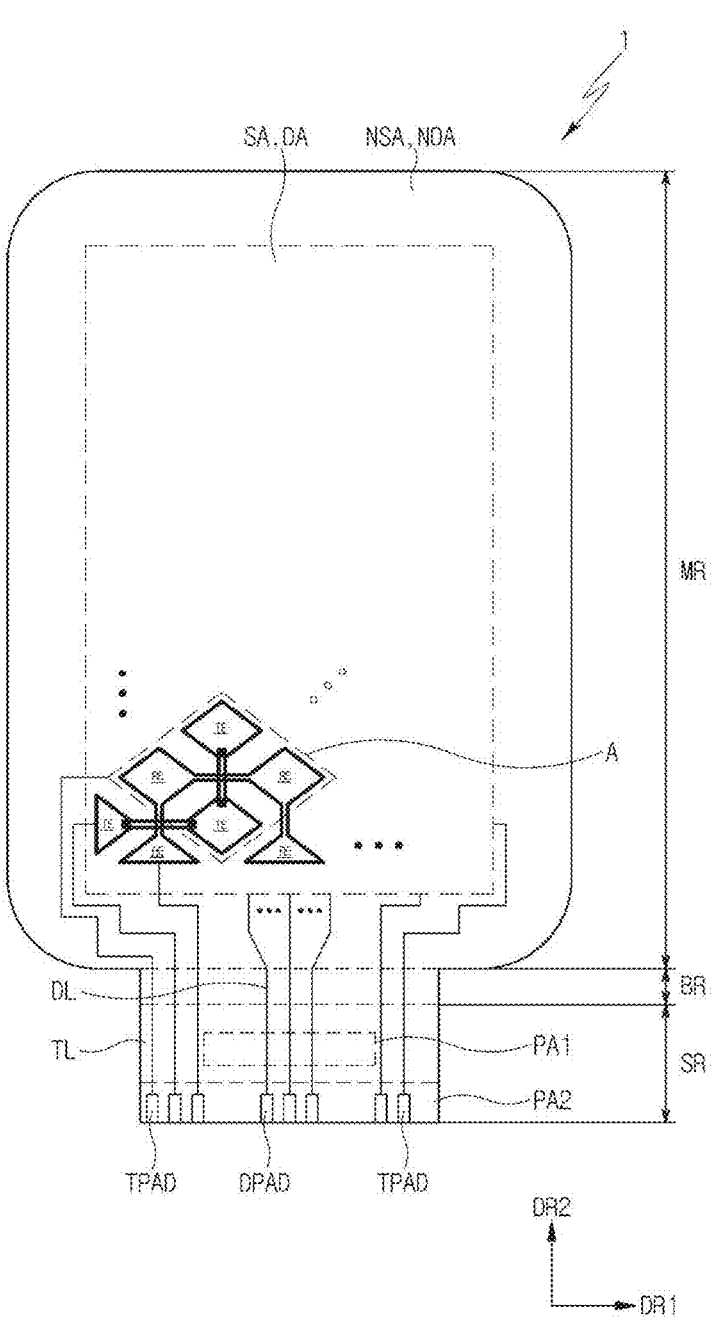
FIG. 4 is a more detailed plan view of the display device according to FIG. 2 according to one or more embodiments of the present disclosure.

The display device 1 may further include a sensing area SA and a non-sensing area NSA near the sensing area SA. The sensing area SA and the non-sensing area NSA may correspond to the display area DA and the non-display area NDA, respectively, and may have the same area, but are not limited thereto. The sensing area SA may be an area in which touch electrodes TE and RE to be described below in FIG. 4 are disposed, and a touch line TL connected to the touch electrodes TE and RE, touch pads TPAD connected to the touch line TL, etc. may be disposed in the non-sensing area NSA.

The substrate part SUB, the circuit element layer CEL, the organic element layer EL, the thin film encapsulation layer TFE, and the touch sensor layer 200 will be described below.

Figure 2:
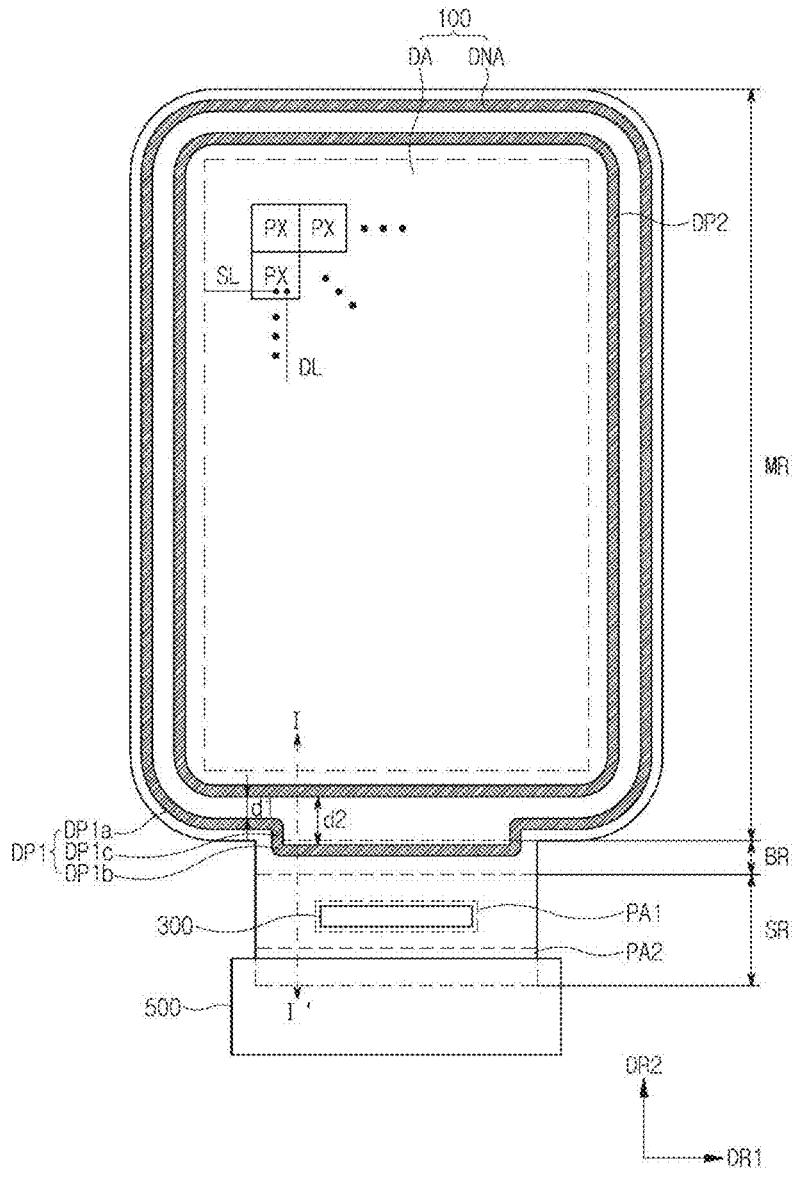
FIG. 2 is a plan view of the display device according to FIG. 1 according to one or more embodiments of the present disclosure.

FIG. 2 is a plan view of the display device according to FIG. 1 according to one or more embodiments of the present disclosure.

Referring to FIG. 2, a planar shape of the display area DA may have a rectangular shape. However, the present disclosure is not limited thereto, and the planar shape of the display area DA may be a square, circular, elliptical, or other polygonal shapes. For example, the display area DA may have a rectangular shape with rounded corners, but is not limited thereto and may also have a rectangular shape with angled corners.

In one or more embodiments, a first direction DR1 and a second direction DR2 are different directions and intersect each other, for example, directions that intersect vertically in a plan view. A third direction DR3 (see FIG. 3) is a direction that intersects the plane on which the first direction DR1 and the second direction DR2 are present, for example, a direction perpendicular to both the first direction DR1 and the second direction DR2. In FIG. 2, in general, the first direction DR1 may be the same as extending directions of short sides of the display panel 100, the second direction DR2 may the same as extending directions of long sides of the display panel 100, and the third direction DR3 may be the same as a stacking direction of the substrate part SUB, the circuit element layer CEL, the organic element layer EL, thin film encapsulation layer TFE, and the touch sensor layer 200 in FIG. 1. However, the directions described in the embodiment should be understood as indicating relative directions, and the embodiment is not limited to the described direction.

The display area DA may include short sides extending in the first direction DR1 and long sides extending in the second direction DR2. The non-display area NDA may surround the display area DA. The non-display area NDA may be disposed at one side and the other side of the display area DA in the first direction DR1 and one side and the other side of the display area DA in the second direction DR2.

The non-display area NDA located at the other side of the display area DA in the second direction DR2 may extend further from a central portion of the other side of the display area DA in the second direction DR2 toward the other side in the second direction DR2. A width of the non-display area NDA in the first direction DR1 further extending from the central portion of the other side of the display area DA in the second direction DR2 toward the other side in the second direction DR2 may be smaller than a width of the non-display area NDA in the first direction DR1 adjacent to the other side of the display area DA in the second direction DR2.

The display device 1 may include a main region MR, a sub-region SR, and a bending region BR between the main area MR and the sub-region SR. The display area DA and the non-display area NDA surrounding the display area DA on all four surfaces form the main area MR, and a portion extending from the central portion of the other side of the display area DA in the second direction DR2 toward the other side in the second direction DR2 may form the bending region BR and the sub-region SR. The bending region BR may be disposed between the sub-region SR and the main region MR, and the bending region BR may be configured to be bent. The sub-region SR may include a first pad area PA1 and a second pad area PA2 located at an end portion of the other side of the sub-region SR in the second direction DR2. The display device 1 may further include a data driver 300 and a printed circuit board 500. The data driver 300 may be disposed in the first pad area PA1, and the printed circuit board 500 may be attached to the second pad area PA2. A plurality of pads connected to the data driver 300 and the printed circuit board 500 may be disposed in each of the first pad area PA1 and the second pad area PA2. The data driver 300 may be formed, for example, in the form of a driving chip (IC), but is not limited thereto. In one embodiment, an example in which the data driver 300 is disposed in a chip on plastic type that is directly mounted on the display panel 100, but the present specification is not limited thereto and is disposed in a chip on glass type or a chip on film type.

As described above in FIG. 1, the display area DA may include a plurality of pixels PX. The plurality of pixels PX may each be connected to a scan line SL and a data line DL. In addition to the scan line SL and the data line DL, the pixel PX may include a high voltage power line, a low voltage power line, or various lines in the art, and a capacitor.

The display device 1 according to one or more embodiments may further include a first dam part DP1 and a second dam part DP2. The first dam part DP1 and the second dam part DP2 may each surround the display area DA. The first dam part DP1 and the second dam part DP2 may each have a closed loop shape that fully surrounds the display area DA. The second dam part DP2 may be disposed between the first dam part DP1 and the display area DA. The second dam part DP2 may be disposed between the display area DA and the bending region BR to be described below.

The first dam part DP1 and the second dam part DP2 may each be disposed in the non-display area NDA. For example, the second dam part DP2 may be disposed in the non-display area NDA adjacent to the display area DA and disposed in the main region MR. The first dam part DP1 may be disposed outside the second dam part DP2 to surround the second dam part DP2. The second dam part DP2 may include a main dam portion DP1a, a protruding dam portion DP1b, and a connection dam portion DP1c. In general, the main dam portion DP1a may be disposed at one side and the other side of the display area DA in the first direction DR1 and disposed in the non-display area NDA disposed adjacent to the one side of the display area DA in the second direction DR2. The main dam portion DP1a may be disposed at the periphery of the non-display area NDA adjacent to the other side of the display area DA in the second direction DR2. The main dam portion DP1a disposed in the non-display area NDA disposed adjacent to the one side and the other side of the display area DA in the first direction DR1 and the one side of the display area DA in the second direction DR2, and at the periphery of the non-display area NDA adjacent to the other side of the display area DA in the second direction DR2 may be formed integrally. The main dam portion DP1a may be disposed in the main region MR.

The protruding dam portion DP1b may be disposed in the bending region BR and may not be disposed in the main region MR. In other words, the main dam portion DP1a and the second dam part DP2 may be disposed to have a first separation distance d1, and the protruding dam portion DP1b and the second dam part DP2 may be disposed to have a second separation distance d2 greater than the first separation distance d1. The main dam portion DP1a and the protruding dam portion DP1b may be connected through the connection dam portion DP1c. The connection dam portion DP1c may be disposed throughout the bending region BR and the main region MR, but is not limited thereto. In other words, when the protruding dam portion DP1b is disposed in the bending region BR adjacent to the boundary between the bending region BR and the main region MR, the connection dam portion DP1c may be disposed only in the main region MR.

In one or more embodiments, the protruding dam portion DP1b may be disposed in the main region MR.

In one or more embodiments, the second separation distance d2 may be equal to the first separation distance d1.

Figure 3:
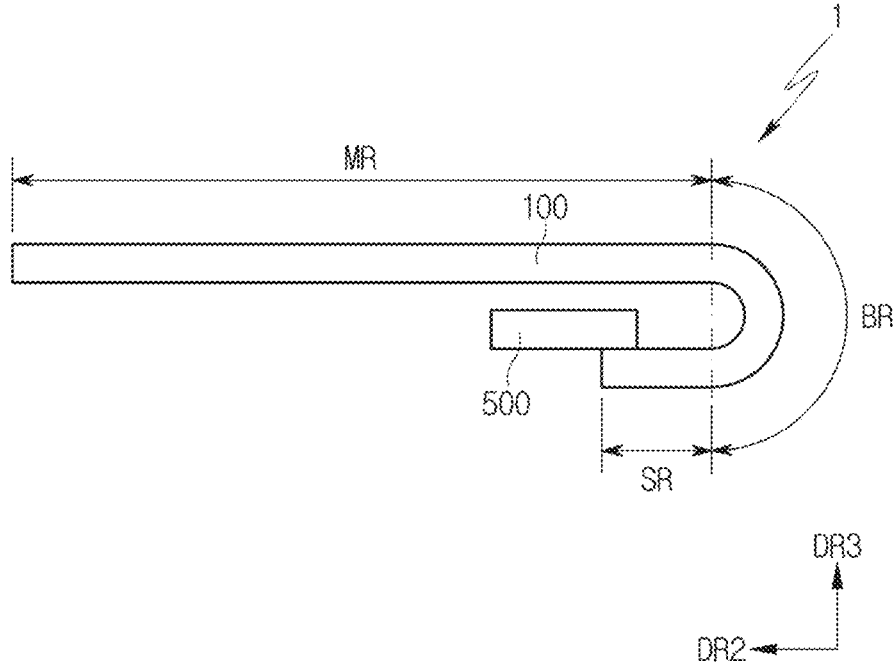
FIG. 3 is a cross-sectional view showing a bent state of the display device according to FIG. 1 according to one or more embodiments of the present disclosure.

FIG. 3 is a cross-sectional view showing a bent state of the display device according to FIG. 1 according to one or more embodiments of the present disclosure.

Referring to FIG. 3, the bending region BR of the display panel 100 of the display device 1 according to one or more embodiments may be bent in the thickness direction (or the third direction DR3). Therefore, the main region MR and the sub-region SR may overlap each other in the thickness direction. The display panel 100 may be bent in such a way that a lower surface of the main region MR and an upper surface of the sub-region SR face each other. The printed circuit board 500 may be attached to an end portion of the sub-region SR.

Figure 5:
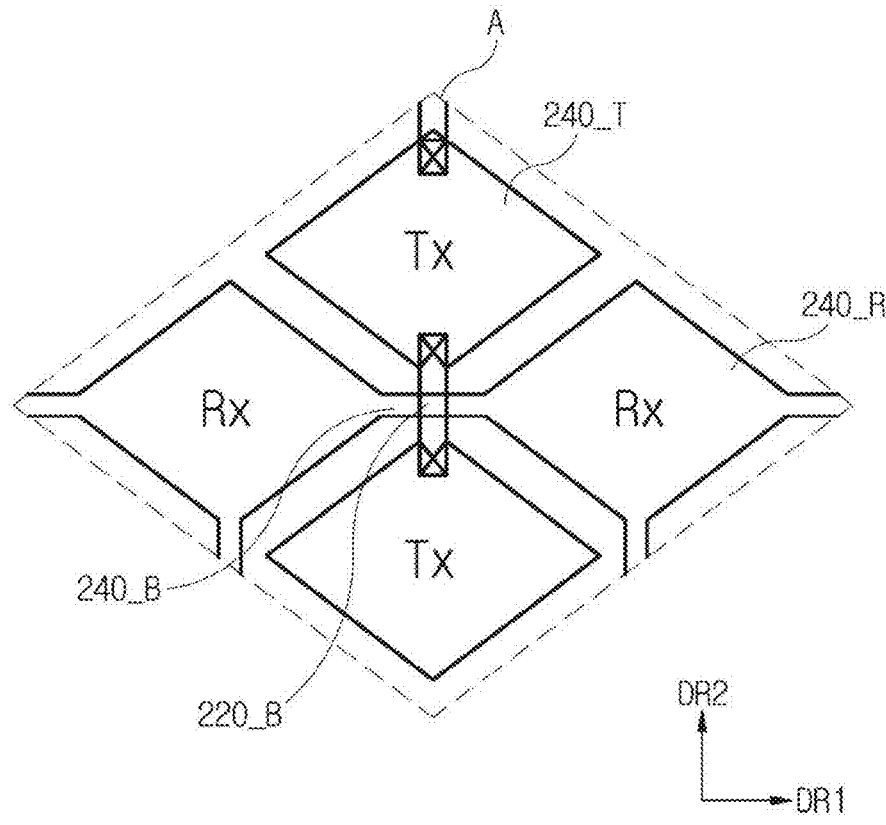
FIG. 5 is an enlarged plan view of area A of FIG. 4 according to one or more embodiments of the present disclosure.

FIG. 4 is a more detailed plan view of the display device according to FIG. 2 according to one or more embodiments of the present disclosure. FIG. 5 is an enlarged plan view of area A of FIG. 4 according to one or more embodiments of the present disclosure. FIG. 4 is a plan view of the display device 1 according to FIG. 2 and specifically shows the touch sensor layer 200 (see FIG. 1), and the touch line TL and the touch pad TPAD that are connected to the touch sensor layer 200.

Referring to FIGS. 4 and 5, the touch sensor layer 200 may include a plurality of touch electrodes TE and RE for detecting the user's touch using a capacitance method, and the touch lines TL connecting the plurality of touch electrodes TE and RE with the touch pads PAD. For example, the touch sensor layer 200 may sense the user's touch using a self-capacitance method or a mutual capacitance method.

A plurality of touch electrodes TE 240_T and RE 240_B may be disposed in the sensor area SA. The plurality of touch electrodes TE 240_T and RE 240_B may be disposed on the thin film encapsulation layer TFE and configured to sense a touch of the display area DA.

The plurality of touch electrodes TE 240_T and RE 240_B may generate a mutual capacitance or a self-capacitance to detect the touch of an object or a person. The plurality of touch electrodes TE 240_T and RE 240_B may include a plurality of driving electrodes TE 240_T and a plurality of detecting electrodes RE 240_B.

The plurality of driving electrodes TE 240_T may be arranged in the first direction DR1 and the second direction DR2. The plurality of driving electrodes TE 240_T may be spaced apart from each other in the first direction DR1 and the second direction DR2. The driving electrodes TE 240_T adjacent to each other in the second direction DR2 may be electrically connected through a bridge electrode 220_B.

The plurality of detecting electrodes RE 240_B may extend in the first direction DR1 and may be spaced apart from each other in the second direction DR2. The plurality of detecting electrodes RE 240_B may be arranged in the first direction DR1 and the second direction DR2, and the detecting electrodes RE 240_B adjacent to each other in the first direction DR1 may be electrically connected to a connection part 240_B.

The plurality of driving electrodes TE 240_T and detecting electrodes RE 240_R may each be connected to a plurality of touch pads TPAD through the touch lines TL.

The bridge electrode 220_B may be disposed on a different layer from the plurality of driving electrodes TE 240_T and the plurality of detecting electrodes RE 240_R. The detecting electrodes RE 240_R adjacent to each other in the first direction DR1 may be electrically connected through the connection part 240_B formed on the same layer as the plurality of driving transistors TE 240_T or the plurality of detecting electrodes RE 240_R, and the driving electrodes TE 240_T adjacent to each other in the second direction DR2 may be electrically connected through the bridge electrode 220_B formed on a different layer from the plurality of driving transistors TE 240_T or the plurality of detecting electrodes RE 240_R. Therefore, even when the bridge electrode 220_B overlaps the plurality of detecting electrodes RE 240_R in the thickness direction DR3, the plurality of driving electrodes TE 240_T and the plurality of detecting electrodes RE 240_R may be insulated from each other. The mutual capacitance may be generated between the driving electrode TE 240_T and the detecting electrode RE 240_R.

Figure 6:
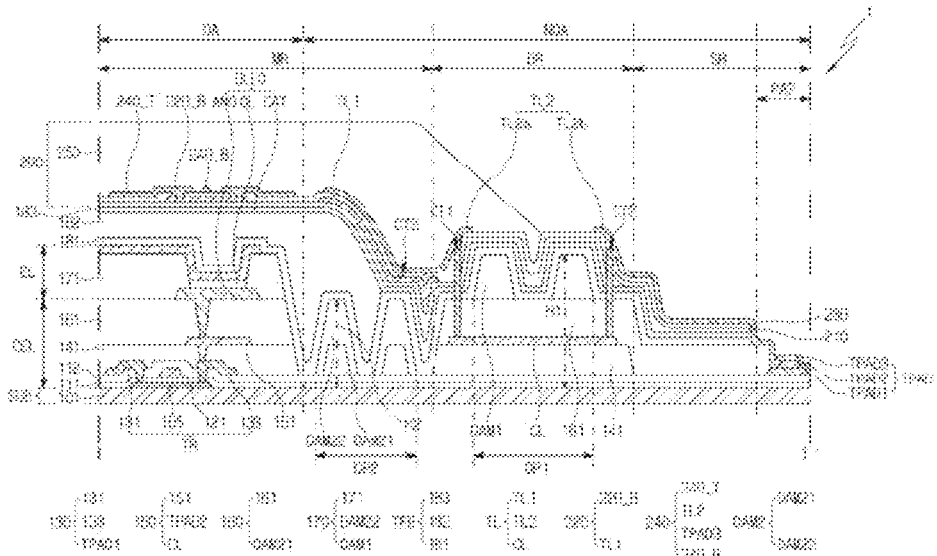
FIG. 6 is a cross-sectional view along line I-I' in FIG. 2 according to one or more embodiments of the present disclosure.

FIG. 6 is a cross-sectional view along line I-I' in FIG. 2 according to one or more embodiments of the present disclosure.

Referring to FIG. 6, the display device 1 may include the substrate part SUB, the circuit element layer CEL formed on the substrate part SUB, the organic element layer EL formed on the circuit element layer CEL, the thin film encapsulation layer TFE formed on the organic element layer EL, and the touch sensor layer 200 formed on the thin film encapsulation layer TFE.

The substrate part SUB may include a base substrate 101. The base substrate 101 may support layers disposed thereon. The base substrate 101 may be disposed throughout the display area DA and the non-display area NDA. The base substrate 101 may be made of an insulating material such as a polymer resin. Examples of the polymer material may include polyethersulphone (PES), polyacrylate (PA), polyarylate (PAR), polyetherimide (PEI), polyethylene napthalate (PEN), polyethylene terephtalate (PET), polyphenylene sulfide (PPS), polyallylate, polyimide (PI), polycarbonate (PC), cellulose triacetate (CAT), cellulose acetate propionate (CAP), or combinations thereof. The base substrate 101 may be a flexible substrate capable of bending, folding, rolling, etc. An example of a material forming the flexible substrate may be polyimide (PI), but is not limited thereto. The base substrate 101 may be a rigid substrate made of glass, quartz, etc.

The circuit element layer CEL may be formed on the substrate part SUB. The circuit element layer CEL may include a semiconductor layer 105, a gate insulating layer 111 formed on the semiconductor layer 105, a gate conductive layer including a gate electrode GE on the gate insulating layer 111, a first interlayer insulating layer 112 formed on the gate conductive layer, a first source drain conductive layer 130 including a source electrode 131, a drain electrode 133, and a first touch pad portion TPAD1 of a touch pad TPAD, a second interlayer insulating layer 141 formed on the first source drain conductive layer 130, a second source drain conductive layer 150 including a connection electrode 151 formed on the second interlayer insulating layer 141, a second touch pad portion TPAD2 of the touch pad TPAD, and a bending bridge electrode CL, and a first organic layer 160 including a planarization layer 161 formed on the second source drain conductive layer 150 and a second lower dam DAM21.

The organic device layer EL may include an organic light emitting diode OLED including an anode ANO formed on the first organic layer 160, an organic layer OL, and a cathode electrode CAT, and a second organic layer 170 including a bank layer 171, a second upper dam DAM22, and a first dam DAM1.

The thin film encapsulation layer TFE may include a first encapsulation inorganic layer 181 formed on the organic element layer EL, an encapsulation organic layer 182 formed on the first encapsulation inorganic layer 181, and a second encapsulation inorganic layer 183 formed on the encapsulation organic layer 182.

The touch sensor layer 200 may include a touch buffer layer 210 formed on the thin film encapsulation layer TFE, a first touch conductive layer 220 including the bridge electrode 220_B formed on the touch buffer layer 210 and a first touch line portion TL1 of the touch line TL, a touch insulting layer 230 formed on the first touch conductive layer 220, a second touch conductive layer 240 including a driving electrode 240_T formed on the touch insulating layer 230, a second touch line portion TL2 of the touch line TL, and a third touch pad portion TPAD3 of the touch pad TPAD, and a touch organic layer 250 formed on the second touch conductive layer 240. The touch line TL may be connected to the driving touch electrode TE 240_T or the detecting touch electrode RE 240_B. The touch organic layer 250 may not overlap with the touch pad TPAD.

A buffer layer may be disposed on the base substrate 101. The buffer layer can prevent the diffusion of impurity ions and prevent the permeation of moisture or outside air.

Unlike shown, the buffer layer may include a plurality of layers. In other words, the buffer layer may be provided as layers formed by alternately stacking silicon nitride (SiNx) and silicon oxide (SiOx) at least once.

The semiconductor layer 105 may be disposed in the display area DA on the buffer layer. The semiconductor layer 105 may include polycrystalline silicon. The semiconductor layer 105 may include a channel area, a source area, and a drain area. The polycrystalline silicon may be formed by crystallizing amorphous silicon. Examples of the crystallization methods may include a rapid thermal annealing (RTA) method, a solid phase crystallization (SPC) method, an excimer laser annealing (ELA) method, a metal induced crystallization (MIC) method, a metal induced lateral crystallization (MILC) method, a sequential crystallization (SLS) method, etc., but are not limited thereto.

The gate insulating layer 111 may be formed on the semiconductor layer 105. The gate insulating layer 111 may be generally disposed throughout the display area DA and the non-display area NDA. The gate insulating layer 111 may be a gate insulating film having a gate insulating function. The gate insulating layer 111 may include a silicon compound, metal oxide, etc. For example, the gate insulating layer 111 may include silicon oxide, silicon nitride, silicon oxynitride, aluminum oxide, tantalum oxide, hafnium oxide, zirconium oxide, titanium oxide, etc. The materials may be used alone or in combination. Although the drawing shows that the gate insulating layer 111 is formed of a single film, in some cases, the gate insulating layer 111 may be a multilayered film formed of stacked films made of different materials.

The gate conductive layer may be disposed on the gate insulating layer 111.

In one or more embodiments, the gate conductive layer may include the gate electrode GE. In addition, the gate conductive layer may further include a scan signal line that transmits a scan signal to the gate electrode GE. The gate electrode GE may be disposed to overlap the channel area of the semiconductor layer 105.

The gate conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In addition, although the drawing shows only the case where the gate conductive layer is a single layer, in some cases, the gate conductive layer may be formed as a multilayered layer. In this case, the multilayered film of the gate conductive layer may be formed as a stacked film made of different metals among the above-described metals.

The first interlayer insulating layer 112 may be disposed on the gate conductive layer. The first interlayer insulating layer 112 may be disposed throughout the display area DA and the non-display area NDA.

The first interlayer insulating layer 112 may insulate the gate conductive layer and the first source drain conductive layer 130. The first interlayer insulating layer 112 may be an interlayer insulating film.

The first interlayer insulating layer 112 may include an inorganic insulating material such as silicon oxide, silicon nitride, silicon oxynitride, hafnium oxide, aluminum oxide, titanium oxide, tantalum oxide, or zinc oxide, or an organic insulating material such as a polyacrylates resin, an epoxy resin, a phenolic resin, a polyamides resin, a polyimides rein, an unsaturated polyesters resin, a polyphenylenethers resin, a polyphenylenesulfides resin, or benzocyclobutene (BCB). In the drawing, although an example in which the first interlayer insulating layer 112 is the single layer is shown, the present disclosure is not limited thereto and may be a multilayered layer formed of a stacked layer containing different materials.

The first source drain conductive layer 130 may be disposed on the first interlayer insulating layer 112. The first source drain conductive layer 130 may include the source electrode 131, the drain electrode 133, and the first touch pad portion TPAD1. The source electrode 131 may be connected to the source area of the semiconductor layer 105, and the drain electrode 133 may be connected to the drain area of the semiconductor layer 105. The first touch pad portion TPAD2 may be disposed in the second pad area PA2. The first source drain conductive layer 130 may include aluminum (Al), copper (Cu), titanium (Ti), etc., and may be formed as a multilayered or single layer. In one embodiment, the first source drain conductive layer 130 may have a multilayered structure of Ti/Al/Ti, but is not limited thereto. The source electrode 131, the drain electrode 133, and the first touch pad portion TPAD1 include the same material and may be formed in the same process.

The second interlayer insulating layer 141 may be disposed on the first source and drain conductive layer 130. The second interlayer insulating layer 141 may be disposed in the display area DA and the non-display area NDA. In the non-display area NDA, the second interlayer insulating layer 141 may be disposed in the bending region BR and may also be disposed in portions of the main region MR and the sub-region SR that are adjacent to the bending region BR. The second interlayer insulating layer 141 may include an organic material such as a polyacrylates resin, an epoxy resin, a phenolic resin, a polyamides resin, a polyimides rein, an unsaturated polyesters resin, a poly phenylenethers resin, a polyphenylenesulfides resin, or benzocyclobutene (BCB).

The second source drain conductive layer 150 may be disposed on the second interlayer insulating layer 141. The second source drain conductive layer 150 may include the connection electrode 151 connected to the drain electrode 133, the second touch pad portion TPAD2 disposed on the first touch pad portion TPAD1 and directly disposed on the first touch pad portion TPAD1, and the bending bridge electrode CL connected to the touch line TL at the periphery of the bending region BR and passing through the bridge region BR. The second source drain conductive layer 150 may include aluminum (Al), copper (Cu), titanium (Ti), etc., and may be formed as a multilayered or single layer. In one or more embodiments, the second source drain conductive layer 150 may have a multilayered structure of Ti/Al/Ti, but is not limited thereto. The connection electrode 151, the second touch pad portion TPAD2, and the bending bridge electrode CL may include the same material and may be formed in the same process.

The first organic layer 160 may be disposed on the second source and drain conductive layer 150. The first organic layer 160 may include the planarization layer 161 and the second lower dam DAM21.

The first organic layer 160 may include an organic material such as a polyacrylates resin, an epoxy resin, a phenolic resin, a polyamides resin, a polyimides rein, an unsaturated polyesters resin, a poly phenylenethers resin, a polyphenylenesulfides resin, or benzocyclobutene (BCB). The planarization layer 161 and the second lower dam DAM21 may include the same material and may be formed in the same process.

The planarization layer 161 may be disposed in the display area DA, the bending region BR, and the sub-region SR. In the display area DA, the planarization layer 161 may be disposed on the connection electrode 151 and the second interlayer insulating layer 141. In the bending region BR, the planarization layer 161 may be disposed on the bending bridge electrode CL and the second interlayer insulating layer 141. In the sub-region SR, the planarization layer 161 may be disposed on the first interlayer insulating layer 112.

The second lower dam DAM21 may form a second dam DAM2 together with the second upper dam DAM22.

The anode ANO may be disposed on the planarization layer 161 in the display area DA. The anode ANO may pass through the planarization layer 161 and may be electrically connected to the connection electrode 151. The connection electrode 151 may electrically connect the anode ANO with the drain electrode 133.

The second organic layer 170 may be disposed on the anode ANO. The second organic layer 170 may include the bank layer 171, the second upper dam DAM22, and the first dam DAM1.

The second organic layer 170 may include an organic material such as a polyacrylates resin, an epoxy resin, a phenolic resin, a polyamides resin, a polyimides rein, an unsaturated polyesters resin, a poly phenylenethers resin, a polyphenylenesulfides resin, or benzocyclobutene (BCB). The bank layer 171, the second upper dam DAM22, and the first dam DAM1 may include the same material and may be formed in the same process.

The bank layer 171 may be disposed in the display area DA and may expose a portion of an upper surface of the anode ANO. The bank layer 171 can define an emission area by exposing a central portion of the upper surface of the anode ANO. In the display area DA, an area in which the bank layer 171 is disposed can be defined as a non-emission area.

The second upper dam DAM22 may be disposed on a second lower dam DMA21. The second upper dam DAM22 may overlap the second lower dam DAM21 in the thickness direction. A width of the second upper dam DAM22 may be greater than a width of the second lower dam DAM21, and the second upper dam DAM22 may cover side surfaces of the second lower dam DAM21.

The second dam DAM2 may include the second lower dam DAM21 and the second upper dam DAM22, and one or more second dams DAM2 may be provided. In FIG. 6, an example in which two second dams DAM2 are provided has been shown. Two or more second dams DAM2 may be disposed to be spaced apart from each other. One or more second dams DAM2 may be disposed in the second dam part DP2. The second dam DAM2 can prevent the encapsulation organic layer 182 of the thin film encapsulation layer TFE to be described below from overflowing into the bending region BR. For example, the encapsulation organic layer 182 may end at the second dam DAM2 located externally among the two second dams DAM2. Therefore, the encapsulation organic layer 182 does not extend to the bending region BR and may not overlap at all components located in the bending region BR. The encapsulation organic layer 182 may not overlap the first dam DAM1.

The first dam DAM1 may be disposed in the bending region BR without the second dam DAM2 being in the bending region BR. The first dam DAM1 may be disposed in the first dam part DP1. One or more first dams DAM1 may be provided. In FIG. 6, an example in which two first dams DAM1 are provided has been shown. Two or more first dams DAM1 may be disposed in the first dam part DP1. The first dam DAM1 can prevent the touch organic layer 250 to be described below from overflowing into the sub-region SR. For example, the touch organic layer 250 may end at the first dam DAM1 located externally among the two first dams DAM1 without extending past an end of the first dam DAM1. Therefore, the touch organic layer 250 does not extend to the sub-region SR and may not overlap at all with the components located in the sub-region SR. The first dam DAM1 may be disposed on the second interlayer insulating layer 141 and the planarization layer 161. The first dam DAM1 may be disposed to overlap the second interlayer insulating layer 141 and the planarization layer 161.

In some embodiments, a spacer may be further disposed on the second organic layer 170. The spacer may include at least one of the exemplified materials of the second organic layer 170. In some embodiments, at least one of the first dam DAM1 and the second dam DAM2 may be formed to further include the spacer. For example, the first dam DAM1 may have a structure in which the spacer is stacked on the first dam DAM1 of FIG. 6, and the second dam DAM2 may have a structure in which the second lower dam DAM21, the second upper dam DAM22, and the spacer are stacked.

For example, the first dam DAM1 and the second dam DAM2 may have various stacking structures. In one or more embodiments, the first dam DAM1 may have a structure in which the first dam DAM1 of FIG. 6 and the planarization layer 161 disposed thereunder are stacked. In such cases, the planarization layer 161 may be patterned like the first dam DAM1, and the patterned planarization layer 161 may be stacked with the first dam DAM1 of FIG. 6 to form the first dam.

In one or more embodiments, the second dam DAM2 does not include the second lower dam DAM21 and may be formed only as the second upper dam DAM22.

In one or more embodiments, the second dam DAM2 does not include the second upper dam DAM22 and may be formed only as the second lower dam DAM21.

An upper surface of the first dam DAM1 may have a first surface height H1 from the base substrate 101, and an upper surface of the second dam DAM2 may have a second surface height H2 from the base substrate 101. The first surface height H1 may be greater than the second surface height H2. The first surface height H1 may be greater than the second surface height H2 by the thickness of the first dam DAM1, but is not limited thereto.

The organic layer OL may be disposed on the upper surface of the anode ANO and in an opening of the bank layer 171. In the drawing, although an example in which the organic layer OL is disposed only in the opening of the bank layer 171, the present specification is not limited thereto and may be disposed to extend from the opening of the bank layer 171 to an upper surface of the bank layer 171.

The organic layer OL may include an organic light emitting layer, a hole injection/transport layer, and an electron injection/transport layer.

The cathode CAT is disposed on the organic layer OL and the bank layer 171. The cathode CAT may be a common electrode disposed throughout a plurality of pixels PX in the display area DA. The organic layer OL, the anode ANO, and the cathode CAT may form the organic light emitting diode OLED.

The thin film encapsulation layer TFE is disposed on the cathode CAT. The thin film encapsulation layer TFE may cover the organic light emitting diode OLED. The thin film encapsulation layer TFE may be a stacking film formed by alternately stacking inorganic films and organic films. For example, the thin film encapsulation layer TFE may include the first inorganic layer 181, the encapsulation organic layer 182, and the second encapsulation inorganic layer 183 that are stacked sequentially. The encapsulation inorganic layers 181 and 182 may include an inorganic material. The encapsulation organic layer 182 may include an organic material. The encapsulation organic layer 182 may not overlap with the first dam DAM1. The encapsulation organic layer 182 may not overflow into the bending region BR by the second dam DAM2 and may end inside the second dam DAM2 without extending past an end of the second dam DAM2. In the second dam part DP2, the second encapsulation inorganic layer 183 may be in direct contact with the first encapsulation inorganic layer 181. For example, since the encapsulation organic layer 182 ends inside the second dam DAM2, the encapsulation organic layer 182 may not be disposed on the second dam DAM2. On the second dam DAM2, the second encapsulation inorganic layer 183 may be in direct contact with the first encapsulation inorganic layer 181.

The encapsulation inorganic layers 181 and 183 may be disposed both in the display area DA and the non-display area NDA. The encapsulation inorganic layers 181 and 183 may be disposed in the bending region BR and the sub-region SR and are not disposed in the second pad area PA2 and may expose the second touch pad portion TPAD2.

The touch sensor layer 200 may be disposed on the thin film encapsulation layer TFE. The touch buffer layer 210 may be disposed on the second encapsulation inorganic layer 183.

The touch buffer layer 210 can block a chemical solution (developer, etchant, etc.) used in the manufacturing process of the touch electrodes 240_T and 240_R disposed on the touch buffer layer 210 or moisture from the outside from permeating the organic light emitting diode OLED including the organic layer. Therefore, the touch buffer layer 210 can prevent damage to the organic light emitting diode OLED vulnerable to a chemical solution or moisture. The touch buffer layer 210 may include an inorganic material or an organic material. The touch buffer layer 210 may extend from the display area DA to the bending region BR and the sub-region SR and may expose the second touch pad portion TPAD2 in the second pad area PA2.

The first touch conductive layer 220 may be disposed on the touch buffer layer 210. The first touch conductive layer 220 may include the bridge electrode 220_B and the first touch line portion TL1. The bridge electrode 220_B may be disposed in the sensor area SA (or the display area DA) to electrically connect the driving electrodes 240_T adjacent to each other. The bridge electrode 220_B may be insulated with the connection part 240_B and the touch insulating layer 230 interposed therebetween.

In FIG. 6, although an example in which the bridge electrode 220_B electrically connects the driving electrodes 240_T adjacent to each other is shown, the present disclosure is not limited thereto, and the bridge electrode 220_B may electrically connect the sensing electrodes 240_R adjacent to each other, and the connection part 240_B may electrically connect the driving electrodes 240_T adjacent to each other.

The first touch line portion TL1 may be disposed in the display area DA and the non-display area NDA. The first touch line portion TL1 may be electrically connected to the detecting electrode 240_R or the driving electrode 240_T. The first touch line portion TL1 may pass through the second dam part DP2 and extend to the bending region BR. The first touch line portion TL1 may form the touch line TL together with the second touch line portion TL2 and serve to electrically connect the touch electrodes 240_T and 240_R with the touch pad TPAD.

The touch insulating layer 230 may be disposed on the first touch conductive layer 220. The touch insulating layer 230 may include an inorganic material. The touch insulating layer 230 may extend from the display area DA to the bending region BR and the sub-region SR and expose the second touch pad portion TPAD2 in the second pad area PA2.

The second touch conductive layer 240 may be disposed on the touch insulating layer 230. The second touch conductive layer 240 may include the driving electrode 240_T, the second touch line portion TL2, and the third touch line portion TPAD3.

The second touch line portion TL2 may include a 2-1 touch line portion TL2a and a 2-2 touch line portion TL2b. The 2-1 touch line portion TL2a may overlap the first touch line portion TL1 in the thickness direction. The 2-1 touch line portion TL2a may be disposed in portions of the main region MR and the bending region BR. The 2-1 touch line portion TL2a may be electrically connected to the first touch line portion TL1 through a third contact hole CT3 passing through the touch insulating layer 230 in the thickness direction. The 2-1 touch line portion TL2a may be electrically connected to the first touch line portion TL1 through the third contact hole CT3 passing through the touch insulating layer 230 in the thickness direction, thereby reducing the resistance of the touch line TL. The 2-1 touch line portion TL2a may not extend past a first end (e.g., left end) of the first dam part DP1. The third contact hole CT3 may be located on the second dam part DP2, but is not limited thereto. The 2-1 touch line portion TL1a may be electrically connected to the bending bridge electrode CL in the bending region BR. The 2-1 touch line portion TL1a may be electrically connected to the bending bridge electrode CL through the first contact hole CT1 passing through the touch insulating layer 230, the touch buffer layer 210, the second encapsulation inorganic layer 183, the first encapsulation inorganic layer 181, and the planarization layer 161. The first contact hole CT1 may be disposed in the bending region BR, but may not be limited thereto. The first contact hole CT1 may be disposed between the second dam DAM2 and the first dam DAM1. The 2-2 touch line portion TL2b may be disposed in a portion of the bending region BR and the sub-region SR. The 2-2 touch line portion TL2b may be electrically connected to the bending bridge electrode CL in the bending region BR. The 2-2 touch line portion TL1b may be electrically connected to the bending bridge electrode CL through the second contact hole CT2 passing through the touch insulating layer 230, the touch buffer layer 210, the second encapsulation inorganic layer 183, the first encapsulation inorganic layer 181, and the planarization layer 161. The second contact hole CT2 may be disposed in the bending region BR, but may not be limited thereto. The second contact hole CT2 may be disposed between the first dam DAM1 and the touch pad TPAD.

The touch line TL according to one or more embodiments may include the first touch line portion TL1, the second touch line portion TL2, and the bending bridge electrode CL. The touch line TL may include the bending bridge electrode CL made of a flexible material compared to the first and second touch line portions TL1 and TL2 in the bending region BR, thereby preventing the disconnection or cracks of the touch line TL due to bending. The bending bridge electrode CL may be placed under the first dam part DP1, and the bending bridge electrode CL may electrically connect the 2-1 touch line portion TL2a with the 2-2 touch line portion TL2b.

The 2-2 touch line portion TL2b may be connected to the third touch pad portion TPAD3 in the second pad area PA2. The 2-2 touch line portion TL2b may not extend past a second end (e.g., right end) of the first dam part DP1. The third touch pad portion TPAD3 may overlap the second touch pad portion TPAD2 in the thickness direction and may be directly disposed on the second touch pad portion TPAD2. The third touch pad portion TPAD3 may be disposed both on an upper surface and side surfaces of the second touch pad portion TPAD2. The third touch pad portion TPAD3 may be in direct contact with an outer portion of the upper surface of the first touch pad portion TPAD1 exposed by the second touch pad portion TPAD2, but is not limited thereto.

The touch organic layer 250 may be disposed on the second touch conductive layer 240. The touch organic layer 250 may be formed on the second touch conductive layer 240 using an inkjet method. In the process of forming the touch organic layer 250 on the second touch conductive layer 240 using the inkjet method, the touch organic layer 250 may overflow the sub-region SR, and to prevent the same, the second dam DAM2 and other dams may be additionally needed. Conventionally, a separate organic layer was used between the touch organic layer 250 and the second touch conductive layer 240 to form a dam for prevent the overflowing of the touch organic layer 250 in the first dam part DP1. However, in this case, a process of the display device 1 was complicated because a process of forming the separate organic layer and a process of forming the dam using the separate organic layer as a mask were added. However, according to the display device 1 according to one or more embodiments of the present disclosure, since the first dam DAM1 is formed together without forming the separate organic layer in the process of forming the second upper dam DAM22 of the second dam DAM2, the process of forming the separate organic layer and the process of forming the dam using the separate organic layer as the mask can be omitted. Therefore, it is possible to reduce the number of masks and simplify the manufacturing of the display device 1. The touch organic layer 250 may be disposed in the main region MR and the bending region BR and may end inside the first dam DAM1.

Figure 7:
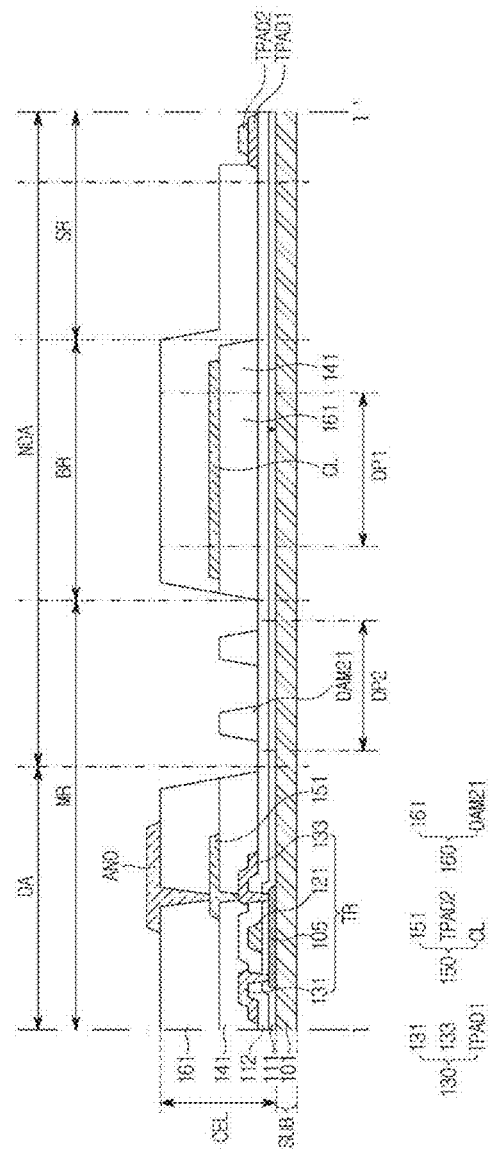
FIGS. 7 and 8 are cross-sectional views for each operation of a process in a method of manufacturing the display device according to one or more embodiments of the present disclosure.
Figure 8:
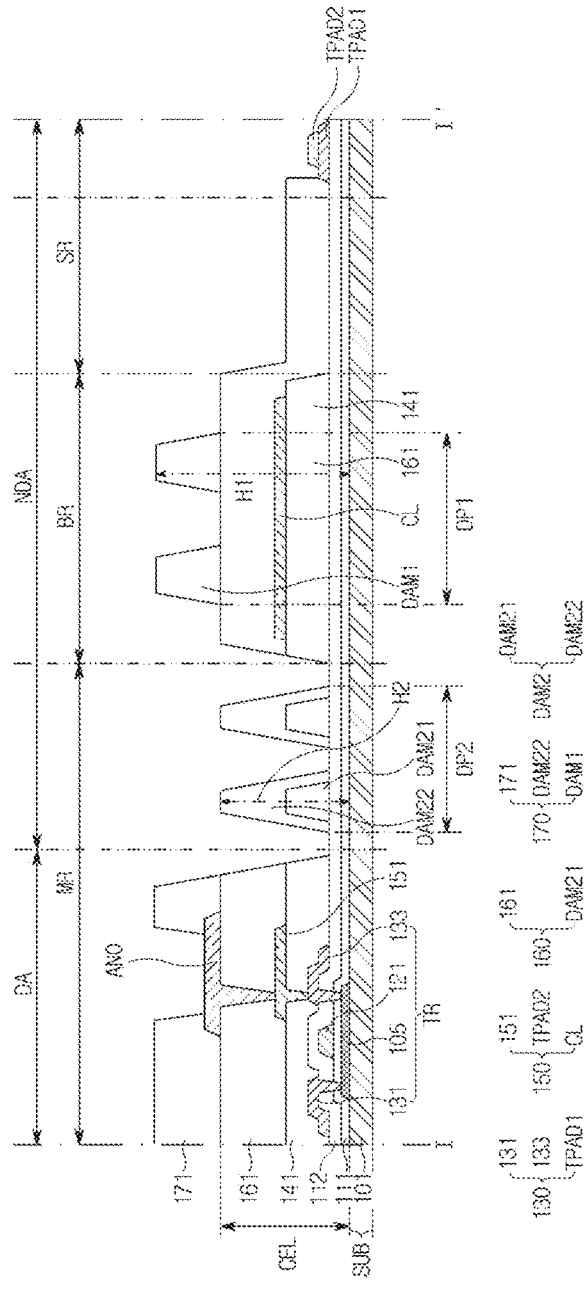

Hereinafter, the method of manufacturing the display device 1 will be described. When the method of manufacturing the display device according to FIGS. 7 and 8 is described, the description will be made with reference to FIG. 6 together. When the method of manufacturing the display device based on FIGS. 7 and 8 is described, overlapping descriptions of the components of the display device 1 already described in FIG. 6 may be omitted, and operations of manufacturing the already described components of the display device 1 may be performed in the stacking order of the display device 1.

FIGS. 7 and 8 are cross-sectional views for each operation of a process in a method of manufacturing the display device according to one or more embodiments of the present disclosure.

Referring to FIGS. 6 to 8, first, as shown in FIG. 7, the first organic layer 160 is formed on the second source drain conductive layer 150. The first organic layer 160 may include the planarization layer 161 and the second lower dam DAM21.

The first organic layer 160 may include an organic material such as a polyacrylates resin, an epoxy resin, a phenolic resin, a polyamides resin, a polyimides rein, an unsaturated polyesters resin, a poly phenylenethers resin, a polyphenylenesulfides resin, or benzocyclobutene (BCB). The planarization layer 161 and the second lower dam DAM21 may include the same material and may be formed in the same process.

The planarization layer 161 may be disposed in the display area DA, the bending region BR, and the sub-region SR. In the display area DA, the planarization layer 161 may be disposed on the connection electrode 151 and the second interlayer insulating layer 141. In the bending region BR, the planarization layer 161 may be disposed on the bending bridge electrode CL and the second interlayer insulating layer 141. In the sub-region SR, the planarization layer 161 may be disposed on the first interlayer insulating layer 112.

The second lower dam DAM21 may form a second dam DAM2 together with the second upper dam DAM22.

As shown in FIG. 8, after the first organic layer 160 is formed, the second organic layer 170 is formed.

The second organic layer 170 may include an organic material such as a polyacrylates resin, an epoxy resin, a phenolic resin, a polyamides resin, a polyimides rein, an unsaturated polyesters resin, a poly phenylenethers resin, a polyphenylenesulfides resin, or benzocyclobutene (BCB). The bank layer 171, the second upper dam DAM22, and the first dam DAM1 may include the same material and may be formed in the same process.

The bank layer 171 may be disposed in the display area DA and may expose a portion of an upper surface of the anode ANO. The bank layer 171 can define an emission area by exposing a central portion of the upper surface of the anode ANO. In the display area DA, an area in which the bank layer 171 is disposed can be defined as a non-emission area. The first dam DAM1 may be coplanar with the bank layer 171.

The second upper dam DAM22 may be disposed on a second lower dam DMA21. The second upper dam DAM22 may overlap the second lower dam DAM21 in the thickness direction. A width of the second upper dam DAM22 may be greater than a width of the second lower dam DAM21, and the second upper dam DAM22 may cover side surfaces of the second lower dam DAM21.

The second dam DAM2 may include the second lower dam DAM21 and the second upper dam DAM22, and one or more second dams DAM2 may be provided. In FIG. 6, an example in which two second dams DAM2 are provided has been shown. Two or more second dams DAM2 may be disposed to be spaced apart from each other. Two or more second dams DAM2 may be disposed in the second dam part DP2. The second dam DAM2 can prevent the encapsulation organic layer 182 of the thin film encapsulation layer TFE to be described below from overflowing into the bending region BR. For example, the encapsulation organic layer 182 may end at the second dam DAM2 located externally among the two second dams DAM2. Therefore, the encapsulation organic layer 182 does not extend to the bending region BR and may not overlap at all components located in the bending region BR.

The first dam DAM1 may be disposed in the bending region BR. The first dam DAM1 may be disposed in the first dam part DP1. One or more first dams DAM1 may be provided. In FIG. 6, an example in which one first dam DAM2 is provided has been shown. One or more first dams DAM1 may be disposed in the first dam part DP1. The first dam DAM1 can prevent the touch organic layer 250 to be described below from overflowing into the sub-region SR. For example, the touch organic layer 250 may end at the first dam DAM1 located externally among the two first dams DAM1. Therefore, the touch organic layer 250 does not extend to the sub-region SR and may not overlap at all with the components located in the sub-region SR.

Hereinafter, other embodiments of the display device will be described. Hereinafter, in one or more embodiments of the present disclosure, overlapping descriptions of the components of the display device 1 already described in FIG. 6 can be omitted.

Figure 9:
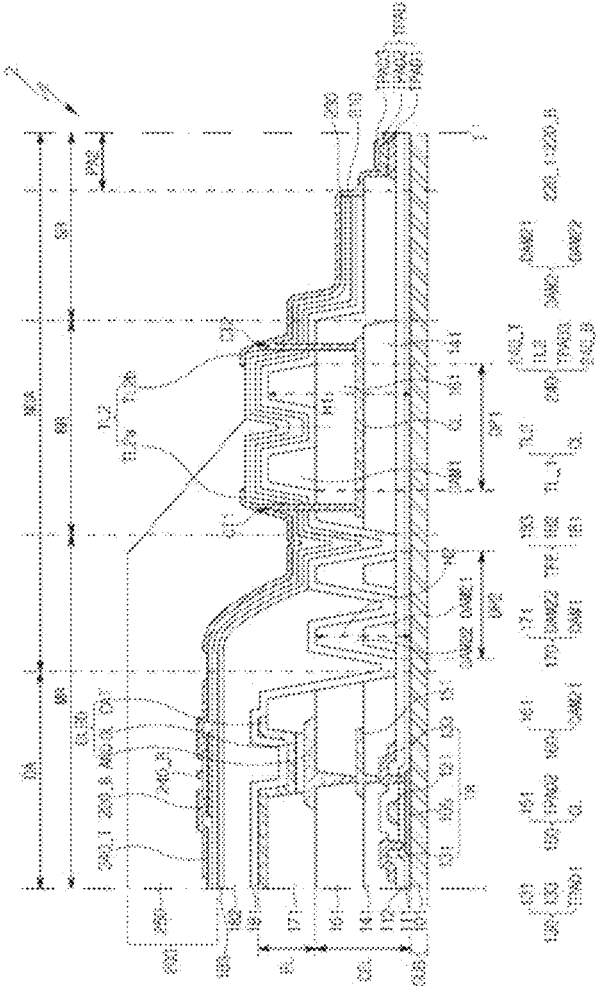
FIG. 9 is a cross-sectional view of a display device according to one or more embodiments of the present disclosure.

FIG. 9 is a cross-sectional view of a display device according to one or more embodiments of the present disclosure.

Referring to FIG. 9, a touch line TL_1 of a display device 2 according to the one or more embodiments differs from the display device 1 according to FIG. 6 in that it does not include the first touch line portion TL1.

More specifically, the touch line TL_1 may include the second touch line portion TL2 and the bending bridge electrode CL. A first touch conductive layer 220_1 may not include the first touch line portion TL1 of FIG. 6.

Since the remaining descriptions are as described above in FIG. 6, detailed descriptions thereof will be omitted.

Figure 10:
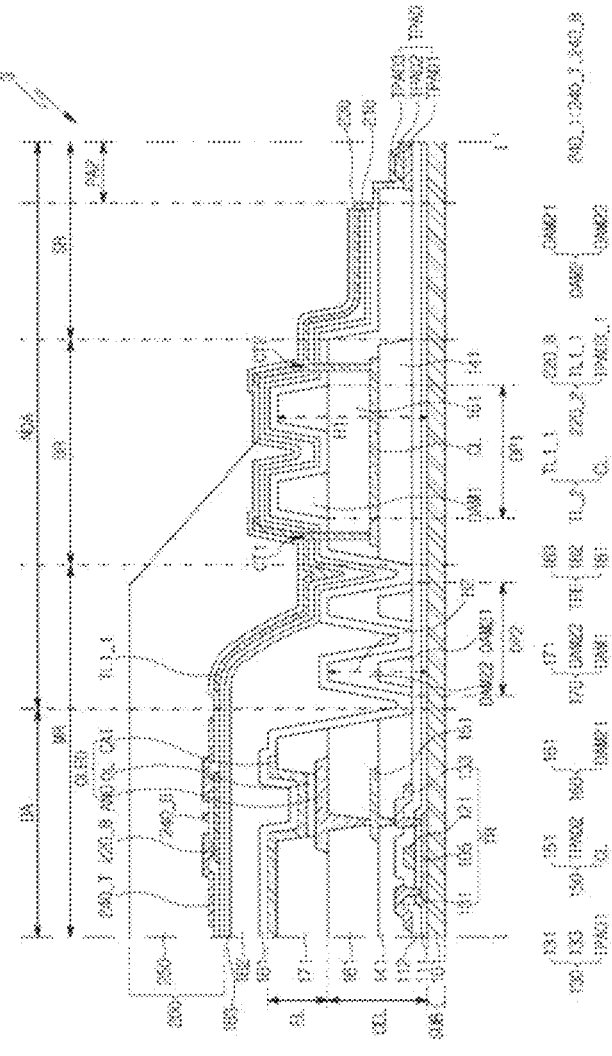
FIG. 10 is a cross-sectional view of a display device according to one or more embodiments of the present disclosure.

FIG. 10 is a cross-sectional view of a display device according to one or more embodiments of the present disclosure.

Referring to FIG. 10, a display device 3 according to the one or more embodiments differs from the display device 1 according to FIG. 6 in that a second touch conductive layer 240_1 does not include the second touch line portion TL2 and the third touch pad portion TPAD3, and a first touch conductive layer 220_2 includes a first touch line portion TL1_1 and a third touch pad portion TPAD3_1.

More specifically, the upper surface of the second touch line portion TL2 of the display device 1 according to FIG. 6 is in direct contact with the touch organic layer 250. In other words, when moisture enters the second touch line portion TL2 through the touch organic layer 250, the corrosion of the second touch line portion TL2 may occur. However, according to the one or more embodiments, by omitting the second touch line portion TL2, forming a touch line TL_2 through a first touch line portion TL1_1 and the bending bridge electrode CL, and arranging the touch insulating layer 230 between the first touch line portion TL1_1 and the touch organic layer 250, it is possible to minimize the permeation of moisture into the touch line TL_2.

Since the remaining descriptions are as described above in FIG. 6, detailed descriptions thereof will be omitted.

Although the embodiments of the present disclosure have been described above with reference to the accompanying drawings, those skilled in the art to which the present disclosure pertains will be able to understand that the above-described technical configuration can be carried out in other specific forms without changing the technical spirit or essential features thereof. Therefore, it should be understood that the above-described embodiments are illustrative and not restrictive in all respects. In addition, the scope of the present disclosure is described by the claims to be described below rather than the detailed description. In addition, the meaning and scope of the claims and all changed or modified forms derived from the equivalent concept should be construed as being included in the scope of the present disclosure.

Description of Reference Numerals

1: display device
100: display panel
200: touch sensor layer
SUB: substrate part
CEL: circuit element layer
EL: organic element layer
TFE: thin film encapsulation layer

What is claimed is:

1. A display device, comprising:
   a base substrate including a display area including a plurality of pixels, and a non-display area adjacent to the display area;
   a first dam on the non-display area of the base substrate;
   a second dam on the non-display area of the base substrate, the second dam between the first dam and the display area;
   an encapsulation organic layer between the first dam and a touch sensor layer, wherein the encapsulation organic layer ends inside the second dam without extending past an end of the second dam;
   a touch conductive layer disposed on the first dam and the second dam, respectively comprising the touch sensor layer; and
   a touch organic layer on the touch conductive layer,
   wherein the touch organic layer ends inside the first dam without extending past an end of the first dam, and the first dam and the second dam include a same material.

2. The display device of claim 1, wherein a height of the first dam from the base substrate is greater than a height of the second dam from the base substrate.

3. The display device of claim 1, further comprising:
   a thin film encapsulation layer between the first dam and the touch sensor layer,
   the thin film encapsulation layer including a first encapsulation inorganic layer, the encapsulation organic layer on the first encapsulation inorganic layer, and a second encapsulation inorganic layer on the encapsulation organic layer.

4. The display device of claim 1, wherein the encapsulation organic layer is not overlapping with the first dam.

5. The display device of claim 1, wherein:
   the non-display area includes a bending region in which the display device is bent in a thickness direction;
   the first dam is in the bending region; and
   the second dam is between the bending region and the display area.

6. The display device of claim 1, further comprising:
   a plurality of first dams on the non-display area of the base substrate.

7. The display device of claim 1, further comprising:
   a second interlayer insulating layer between a bank layer and the base substrate,
   wherein the first dam is on the second interlayer insulating layer.

8. The display device of claim 7, further comprising:
   a planarization layer between the second interlayer insulating layer and the bank layer,
   wherein the first dam is on the second interlayer insulating layer and the planarization layer.

9. A display device, comprising:
   a base substrate including a display area including a plurality of pixels, and a non-display area adjacent to the display area;
   a first dam on the non-display area of the base substrate;
   a second dam on the non-display area of the base substrate, the second dam between the first dam and the display area;
   a touch conductive layer disposed on the first dam and the second dam, respectively comprising a touch sensor layer;
   a touch organic layer on the touch conductive layer, wherein the touch organic layer ends inside the first dam without extending past an end of the first dam, and the first dam and the second dam include a same material; and
   an organic element layer on the display area of the base substrate, the organic element layer including an anode, a bank layer exposing a portion of an upper surface of the anode, an organic layer on the exposed upper surface of the anode, and a cathode on the organic layer.

10. The display device of claim 9, wherein the first dam is coplanar with the bank layer.

11. A display device, comprising:
   a base substrate including a display area including a plurality of pixels, and a non-display area adjacent to the display area;
   a first dam on the non-display area of the base substrate;
   a second dam on the non-display area of the base substrate, the second dam between the first dam and the display area;
   a touch conductive layer disposed on the first dam and the second dam, respectively comprising a touch sensor layer;

a touch organic layer on the touch conductive layer, wherein the touch organic layer ends inside the first dam without extending past an end of the first dam, and the first dam and the second dam include a same material; and a planarization layer between a bank layer and the base substrate, wherein the first dam is on the planarization layer.

12. A display device, comprising:

a display area including a plurality of pixels; and a non-display area located adjacent to the display area, the non-display area including:

a first dam part surrounding the display area in a plan view of the display device, and a second dam part surrounding the display area in the plan view, the second dam part between the first dam part and the display area in the plan view, wherein the first dam part includes:

a main dam portion that is spaced apart from the second dam part by a first separation distance, and a protruding dam portion that protrudes from the main dam portion and spaced apart from the second dam part by a second separation distance that is greater than the first separation distance.

13. The display device of claim 12, wherein each of the first dam part and the second dam part includes a closed loop shape in the plan view.

14. The display device of claim 12, wherein the first dam part further includes a connection dam portion connecting the main dam portion with the protruding dam portion.

15. The display device of claim 13, wherein the non-display area further includes a bending region in which the display device is bent in a thickness direction and the protruding dam portion is in the bending region.

16. A display device, comprising:

a base substrate including a display area having a plurality of pixels, and a non-display area having a pad area;

a circuit element layer on the base substrate;

a light emitting diode on the circuit element layer in the display area, the light emitting diode connected to the circuit element layer;

a first dam in the non-display area;

a second dam in the non-display area between the first dam and the display area;

a thin film encapsulation layer on the light emitting diode, the thin film encapsulation layer including an encapsulation organic layer that extends to the second dam without extending past an end of the second dam; and a touch sensor layer on the thin film encapsulation layer and configured to sense a touch of the display area, the touch sensor layer including a touch organic layer that overlaps the second dam and extends past the second dam to the first dam without extending past an end of the first dam.

17. The display device of claim 16, wherein the second dam includes a second lower dam and a second upper dam on the second lower dam.

18. The display device of claim 17, wherein the circuit element layer includes a first organic layer in the display area and the light emitting diode includes an organic layer on the first organic layer in the display area, and the display device further comprising:

a second organic layer on the first organic layer in the display area, the second organic layer surrounding the light emitting diode in the display area.

19. The display device of claim 18, wherein the second organic layer includes a bank layer that surrounds the light emitting diode in the display area, the second upper dam in the non-display area, and the first dam in the non-display area, wherein the bank layer, the second upper dam, and the first dam include a same material.

20. The display device of claim 18, wherein the first organic layer includes a planarization layer and the second lower dam, and the light emitting diode includes an anode on the planarization layer, wherein the planarization layer and the second lower dam include a same material.

21. The display device of claim 16, wherein the touch sensor layer further comprises:

touch electrodes on the thin film encapsulation layer and configured to sense the touch of the display area;

a touch line connected to one of the touch electrodes, the touch line including a first touch line portion and a second touch line portion, the first touch line portion in the display area and the non-display area and passing through the second dam, the second touch line portion in the non-display area and connected to the first touch line portion;

a first touch conductive layer including the first touch line portion; and a second touch conductive layer including the second touch line portion, the touch organic layer on the second touch conductive layer.

22. The display device of claim 21, further comprising a touch pad in the pad area, the touch pad connected to the second touch line portion, and the touch organic layer is non-overlapping with the touch pad.

23. The display device of claim 21, further comprising a dam part that includes the first dam, wherein the second touch line portion includes a first portion and a second portion, the first portion of the second touch line portion connected to the first touch line portion and without extending past a first end of the dam part, the second portion of the second touch line portion connected to the touch pad without extending past a second end of the dam part.

24. The display device of claim 23, further comprising a bridge electrode under the dam part, the bridge electrode electrically connecting the first portion of the second touch line portion with the second portion of the second touch line portion.

25. The display device of claim 16, wherein the non-display area includes a bending region that is configured to be bent, and the first dam is in the bending region without the second dam being in the bending region.

26. The display device of claim 16, wherein a height of the first dam is greater than a height of the second dam.

* * * * *